United States Patent
Yen et al.

[19]

[11] Patent Number: 5,838,051
[45] Date of Patent: *Nov. 17, 1998

[54] TUNGSTEN POLICIDE CONTACTS FOR SEMICONDUCTOR DEVICES

[75] Inventors: Haw Yen, Hsin Chu; Shaw-Tseng Hsia, Taipei, both of Taiwan

[73] Assignee: Vanguard International Semiconductor Corporation, Hsin-Chu, Taiwan

[*] Notice: This patent issued on a continued prosecution application filed under 37 CFR 1.53(d), and is subject to the twenty year patent term provisions of 35 U.S.C. 154(a)(2).

[21] Appl. No.: 597,528

[22] Filed: Feb. 2, 1996

Related U.S. Application Data

[62] Division of Ser. No. 429,727, Apr. 27, 1995, Pat. No. 5,510,296.

[51] Int. Cl.[6] ................................................. H01L 29/76
[52] U.S. Cl. ........................... 257/412; 257/336; 257/344; 257/408; 257/382; 257/383; 257/384; 257/506; 257/621; 257/774
[58] Field of Search ..................................... 257/621, 336, 257/344, 408, 774, 382, 383, 384, 506, 412, 628, 754, 765; 438/399, 453, 571, 573, 584, 597, 622, 623, 652, 655, 682, 755

[56] References Cited

U.S. PATENT DOCUMENTS

| | | | |
|---|---|---|---|
| 4,644,386 | 2/1987 | Nishizawa et al. | 257/339 |
| 4,648,175 | 3/1987 | Metz, Jr. et al. | 257/742 |
| 5,241,203 | 8/1993 | Hsu et al. | 257/382 |
| 5,250,454 | 10/1993 | Maszara | 437/41 |
| 5,313,089 | 3/1994 | Jones Jr. | 257/296 |
| 5,366,929 | 11/1994 | Cleeves et al. | 437/195 |
| 5,371,041 | 12/1994 | Liou et al. | 437/192 |
| 5,374,591 | 12/1994 | Hasegawa et al. | 437/187 |
| 5,569,947 | 10/1996 | Iwasa et al. | 257/382 |
| 5,569,948 | 10/1996 | Kim | 257/382 |
| 5,650,834 | 7/1997 | Nakagawa et al. | 349/149 |

*Primary Examiner*—Tom Thomas
*Assistant Examiner*—Fetsum Abraham
*Attorney, Agent, or Firm*—George O. Saile; Stephen B. Ackerman

[57] ABSTRACT

A method for creating manufacturable polycide contacts, for use in advanced semiconductor designs using images as small as 0.35 uM, has been developed. An amorphous silicon film, is used as an underlay, to assist in the growth of an overlying tungsten silicide layer. The tungsten silicide deposition is performed using tungsten hexafluoride and silane, and in conjunction with the amorphous silicon underlay, results excellent step coverage in the narrow contact hole. A nitrogen anneal, using high flow rates, optimizes the adhesion characteristics of the tungsten polycide structure.

2 Claims, 5 Drawing Sheets

5,838,051

TUNGSTEN POLICIDE CONTACTS FOR SEMICONDUCTOR DEVICES

This is a division of application Ser. No. 08/429,727, filed on Apr. 27, 1995, issued as U.S. Pat. No. 5,510,296.

BACKGROUND OF THE INVENTION (1) Field of the Invention

The present invention relates to a fabrication method used for semiconductor devices, and more specifically to an improved process for polycide coating of contact holes in a dielectric layer.

(2) Description of Prior Art

The trend in the semiconductor industry to smaller, higher performance silicon devices, has been influenced by the ability of specific semiconductor disciplines to achieve micro-miniaturazation. Advances in photolithography, via more sophisticated exposure cameras, as well as development of more sensitive photoresist materials, have allowed sub-micron images in photoresist materials to be routinely achieved. Comparable breakthroughs in the dry etching technology have allowed the sub-micron images in photoresist to be successfully transferred to underlying semiconductor materials via anisotropic reactive ion etching, (RIE), procedures. Other semiconductor fabrication disciplines, such as low pressure chemical vapor deposition, (LPCVD), and ion implantation, (I/I), have also contributed to the attainment of smaller, higher performing silicon devices.

However with the use of sub-micron feature, for specific elements of a semiconductor device, specific vulnerabilities, in terms of yield and reliability, arise. For example a device feature, needed to be reduced to successfully achieve micro-miniaturazation, is the contact or via hole, used to electrically connect; either two levels of wiring, or an active device region in silicon to an overlying wiring level. With the trend to sub-micron images, contact holes with diameters as small as 0.35 uM have been used. The decreased contact hole diameter, although successful in allowing for the fabrication of smaller silicon chips, has put special demands on the properties of the materials used to fill these small openings. First the material has to inherently possess excellent current carrying capabilities. The excellent electromigration resistance of refractory metals, such as tungsten, and also silicides such as tungsten silicide, has made these materials leading candidates for contact hole filling. An area of concern is the inability of the refractory or silicide, to completely fill the contact, that is the filling process supply adequate step coverage. This becomes more imperative as the contact hole diameter decreases. A solution to the filling criteria is offered by Cleeves, et al, in U.S. Pat. No. 5,366,929, in which a selective fill is described using a sputter etch clean followed by a selective deposition. This solution, although presenting possiblities of optimum fills, is complex and costly. Another area of concern with the use of refractory or silicide fills is the ability to achieve adhesion between the fill material and the contact hole materials. Many solutions have been offered, such as the use of titanium or titanium nitride films as adhesion layers, used to coat the contact hole prior to the fill deposition. Hasegawa, et al, in U.S. Pat. No. 5,374,591, offer a titanium nitride adhesion layer, followed by an etch back of the titanium nitride, at the edges of the contact, again directed at improving the subsequent fill process. Again, however this process is complex and costly. The fabrication process now described in this invention will offer an improved adhesion layer, as well as an optimized fill method enabling simple, reliable and non-costly contacts to be used.

SUMMARY OF THE INVENTION

It is an object of this invention to provide an optimized process for coating narrow diameter contact holes with conductive materials.

It is another object of this invention to use an underlying adhesion layer of amorphous silicon, prior to coating the narrow contact hole with a conductive material.

It is yet another object of this invention to coat the contact hole with tungsten silicide, obtained using silane as one of the reactants.

It is still yet another object of this invention to anneal the polycide filled contact hole, using a high flow of nitrogen.

In accordance with this present invention a method is described for fabricating semiconductor devices, using small diameter contact holes or vias to interconnect specific levels, in which the contacts or vias are partially filled with a polycide material, obtained using an optimized fill process. A small diameter contact hole is provided in a dielctric layer, to active device regions in a semiconductor substrate. After a surface clean, in a dilute hydrofluoric acid solution, a thin layer of amorphous silicon is deposited. An ion implantation process is used to dope the amorphous silicon layer, again followed by a dilute hydrofluoric acid surface clean. A deposition of tungsten silicide, partially filling the small diameter contact hole, is next performed, creating the tungsten polycide, the tungsten silicide-amorphous silicon composite. After patterning of the polycide to obtain the desired image, via RIE procedures, an anneal using a high flow of nitrogen is performed to improve the contact resistance of the polycide to the underlying regions.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating MOSFETs using the optimized polycide contact process will now be covered in detail. The optimized polycide contact process can be used as part of MOSFET devices that are currently being manufactured in industry, therefore only the specific areas unique to understanding this invention will be described in detail.

Figure 1:
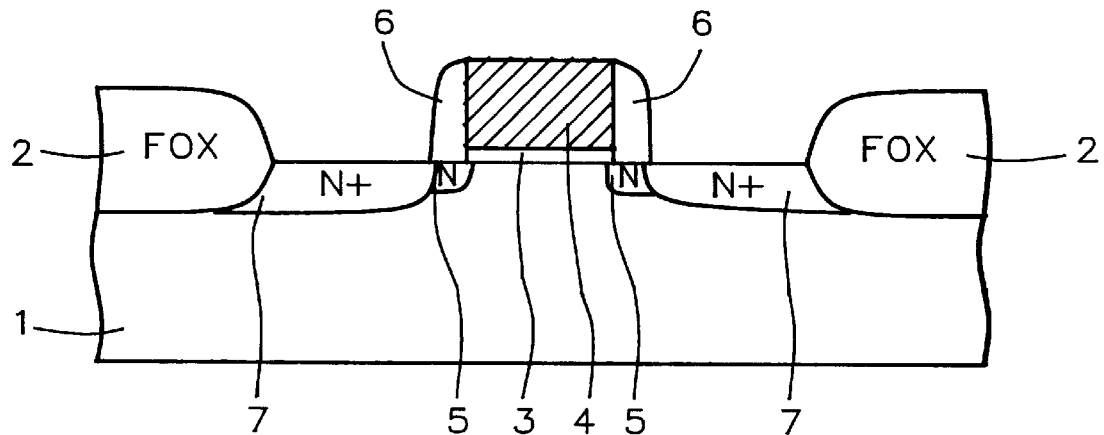
FIG. 1, which schematically illustrates, in cross-sectional style, a metal oxide semiconductor field effect transistor, (MOSFET), device, prior to the initiation of the optimized polycide contact process.

FIG. 1 shows a typical NFET, (N type field effect transistor), to which the optimized polycide contact process will be used with. A substrate, 1, composed of P type, single crystal silicon, with a <100>orientation, is used. A thick field oxide region, 2, (FOX) is formed surrounding the region where the device is to be built. Briefly the method used to create the FOX isolation region is to use an oxidation mask of silicon nitride, overlaying a thin thermal silicon dioxide layer. The desired FOX region is etched open in the composite dielectric, while leaving the subsequent device region protected, using conventional photolithographic and dry etching procedures. After removal of the masking photoresist, and a wet chemical clean, a field oxide is thermally grown, typically to a thickness between about 4000 to 6000 Angstroms. After removal of the oxidation mask, using a hot phosphoric acid solution, for the silicon nitride layer, and a buffered hydrofluoric acid solution for the underlying silicon dioxide layer, a gate oxide, 3, is grown at a temperature between about 850° to 950° C., to a thickness between about 70 to 250 Angstroms. Next a polysilicon layer, 4, is deposited, using LPCVD processing, at a temperature between about 550° to 750° C., to a thickness between about 2000 to 4000 Angstroms. An ion implantation procedure is then used to dope polysilicon layer, 4, using phosphorous, at an energy between about 50 to 100 Kev., at a dose between about 1E13 to 5E14 atoms/cm2. Standard photolithographic, and reactive ion etching, (RIE), processing, using SF6 as an etchant, are next used to create the polysilicon gate structure, 4, shown in FIG. 1.

The MOSFET fabrication process continues by photoresist removal, followed by careful wet chemical cleans. An N type, lightly doped source and drain region, 5, is then created in the semiconductor substrate via ion implantation of phosphorous, at an energy between about 50 to 100 Kev., at a dose between about 1E13 to 5E13 atoms/cm2. A silicon oxide layer is next produced via LPCVD processing, using tetraethylorthosilicate as a source, at a temperature between about 650° to 750° C., to a thickness between about 2000 to 4000 Angstroms. A selective anisotropic RIE procedure is then employed, using CHF3, to form the oxide sidewall spacer, 6. The N+ source and drain regions, 7, are now created via ion implantation of arsenic, at an energy between about 75 to 150 Kev., at a dose between 1E15 to 5E15 atoms/cm2, followed by an activation cycle using either conventional furnace procedures, at a temperature between 850° to 950° C., for a time of between about 10 to 30 min., or via rapid thermal annealing, (RTA), again at a temperature between about 850° to 950° C., but for a time between about 10 to 60 sec.

Figure 2:
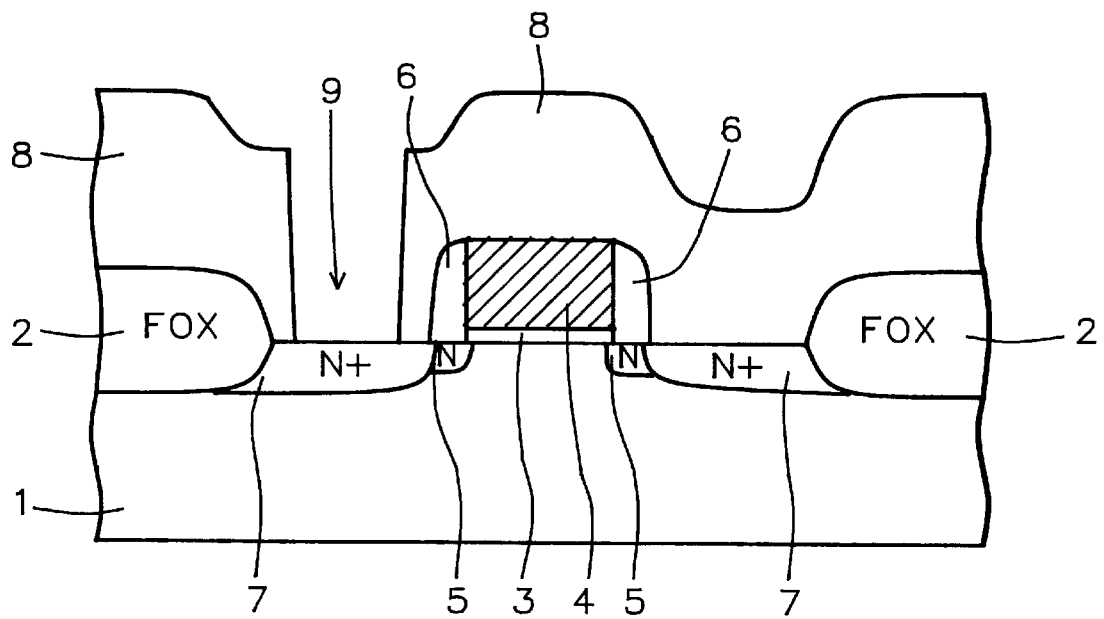
FIGS. 2–6, which schematically illustrate, in cross-sectional style, the specific fabrication stages for the optimized polycide contact process.
Figure 3:
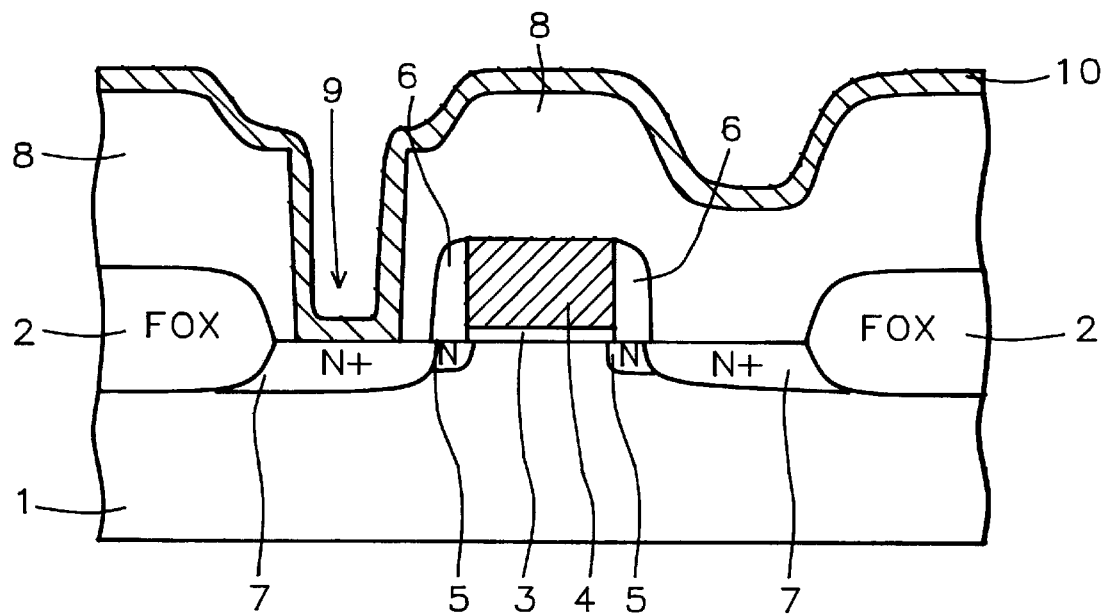

A silicon oxide layer, 8, is formed on the MOSFET structure, using LPCVD processing at a temperature between about 400° to 600° C., to a thickness between about 3000 to 4000 Angstroms. Photolithographic and RIE procedures, using CHF3, or CF4, are used to create contact hole, 9, in silicon oxide layer, 8, exposing source and drain region, 7, in the semiconductor substrate. This is shown schematically in FIG. 2. After photoresist removal, followed by careful organic cleans, the structure is subjected to a 200:1, dilute hydrofluoric, (DHF), acid solution, at a temperature between about 20° to 25° C., for a time between about 60 to 120 sec, for purposes of removing any native oxide from the surface of the N+ source and drain region, 7. A deposition of amorphous silicon, 10, shown in FIG. 3, is then performed, using LPCVD processing at a temperature between about 500° to 550° C., to a thickness between about 300 to 700 Angstroms, and preferably 500 Angstroms. The use of amorphous silicon as an underlay, or adhesion layer for a subsequent overlying silicide layer, rather then polycrystalline grained silicon, is based on the ability of the amorphous seed layer to assist in the growth of the overlying tungsten silicide, to a higher degree then counterparts fabricated with polycrystalline underlying seed layers. The thin amorphous silicon layer, 10, is then subjected to an ion implantation step, using phosphorous at an energy between about 30 to 40 Kev., at dose between about 1E15 to 5E15 atoms/cm2.

Figure 4:
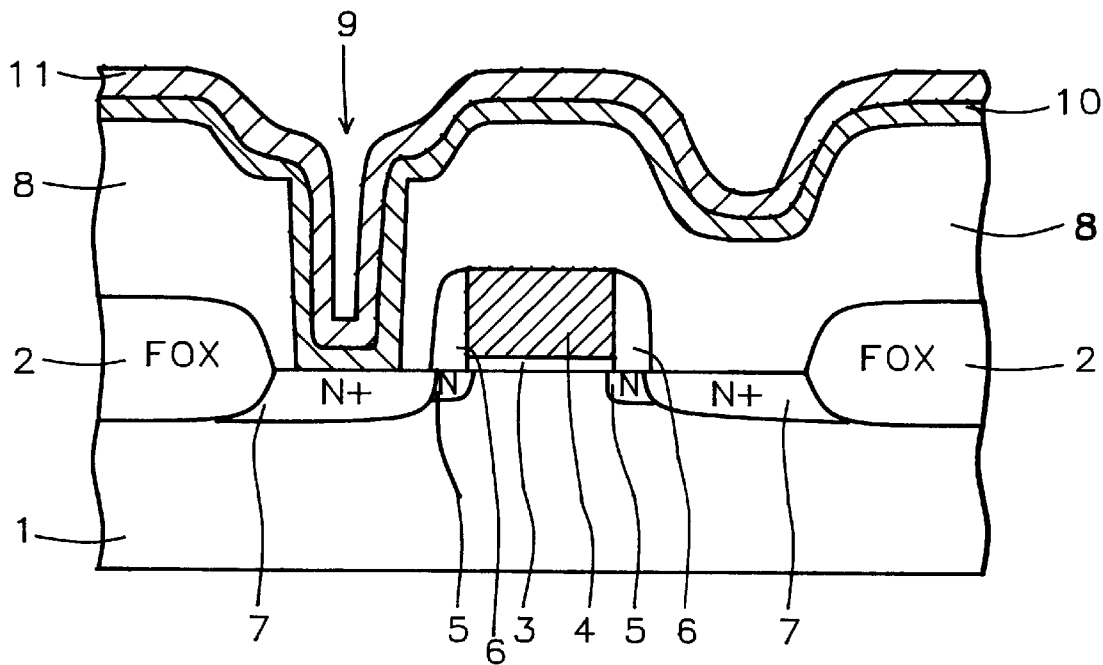

A pre-clean, again using DHF, at a temperature between about 20° to 25° C., for a time between 60 to 120 sec., is used to remove any native oxide from the amorphous silicon layer, 10. An LPCVD process, using tungsten hexafluoride and silane, at a temperature between about 300° to 400° C., is used to deposit a layer of tungsten silicide, 11, shown in FIG. 4, to a thickness between about 1000 to 2000 Angstroms, and preferably 1500 Angstroms. It is critical that the deposition conditions result in excellent step coverage, partially filling contact hole, 9. The use of these deposition conditions, in addition to the use of an amorphous silicon underlay, allowed the above requirements to be met.

Figure 5:
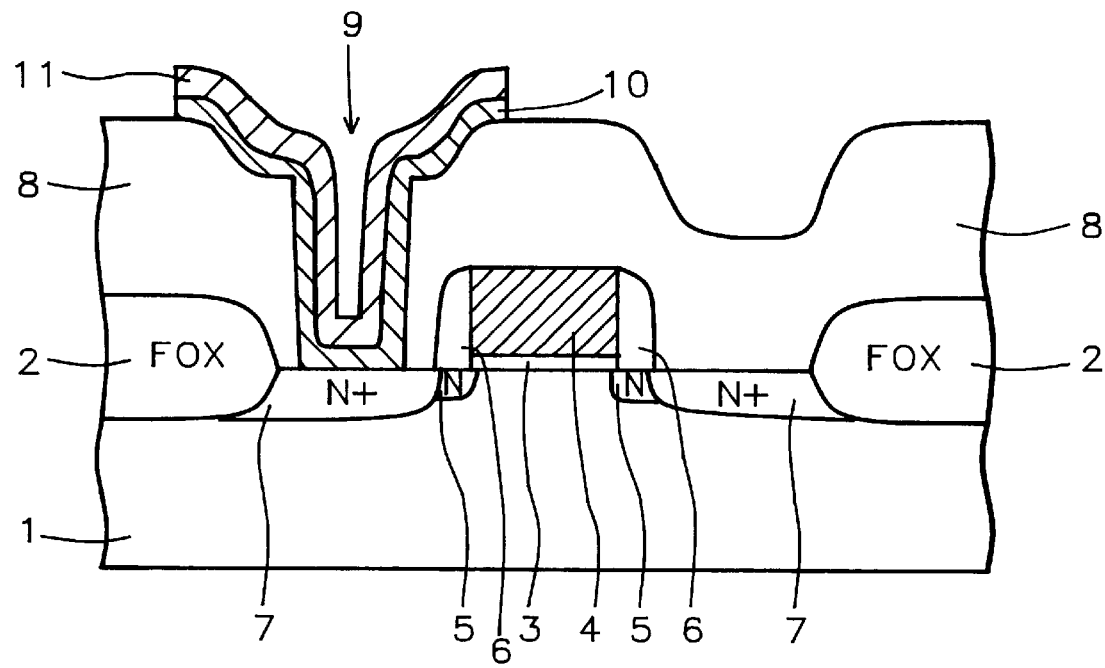

The tungsten silicide-amorphous silicon composite, referred to as the tungsten polycide, can be used as either a contact metallurgy, or as both a contact and interconnect metallization. If the latter is desired the patterning of the tungsten polycide is accomplished using standard photolithographic and RIE procedures. The selective RIE process is carried out using SF6, to etch the tungsten polycide and stop on the underlying oxide layer, 8. After photoresist removal the resulting contact—interconnect metallization is shown schematically in FIG. 5. A critical anneal is now performed in an nitrogen ambient, at a temperature between about 750° to 850° C., and preferably 800° C., for a time between about 30 to 60 min. The anneal step is performed using a high nitrogen flow, between about 25 to 30 slm, and preferably 28 slm, which is critical in not allowing deleterious oxidation formation to occur at tungsten silicide-amorphous Si interface. These conditions, amorphous silicon underlay, tungsten silicide deposition using silane, and a nitrogen anneal at high flow rates, have allowed this process to be successfully used for contact hole diameters as small as 0.35 uM.

Figure 6:
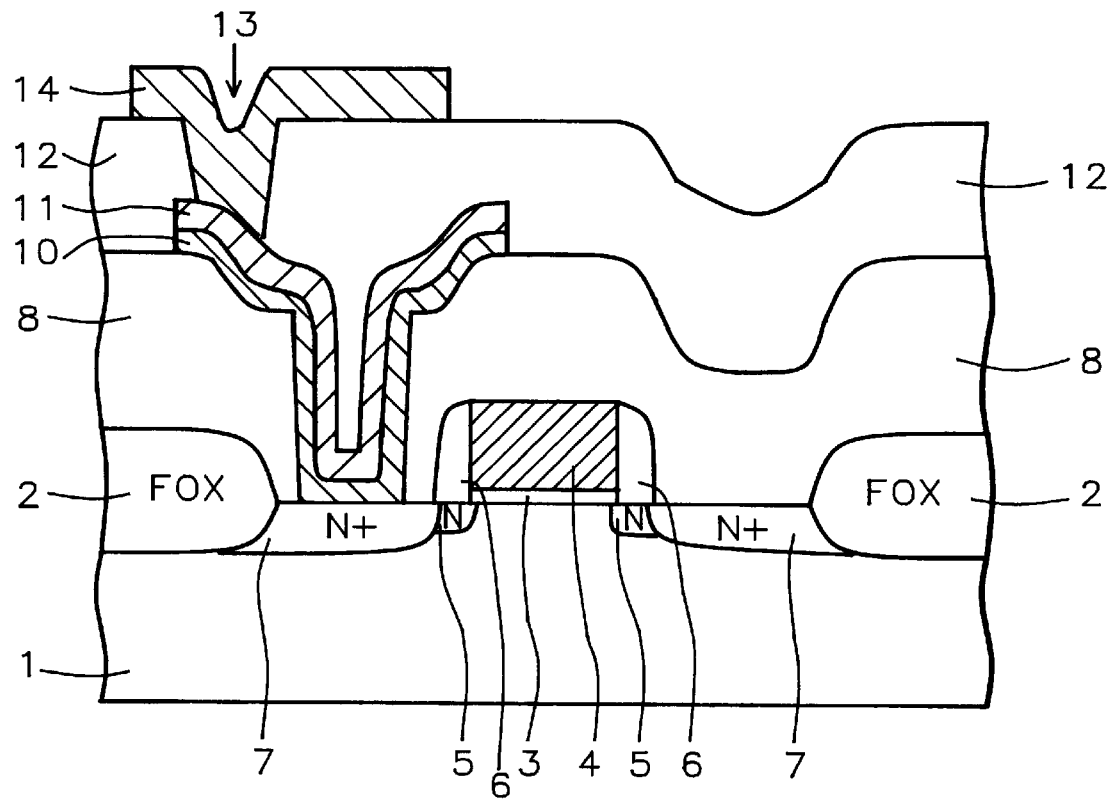

FIG. 6 describes the completion of the MOSFET structure, fabricated using the optimized tungsten polycide contact process. An oxide layer, 12, is deposited to a thickness between about 5000 to 10000 Angstroms. Conventional photolithographic and RIE procedures are used to open via, 13, in oxide layer, 12, to the tungsten polycide contact metallization. After photoresist removal, and careful wet chemical cleans, a deposition of Al—Cu is performed to a thickness between 8000 to 12000 Angstroms. Again standard photolithographic and dry etching is employed to create metal interconnect, 14.

Figure 7:
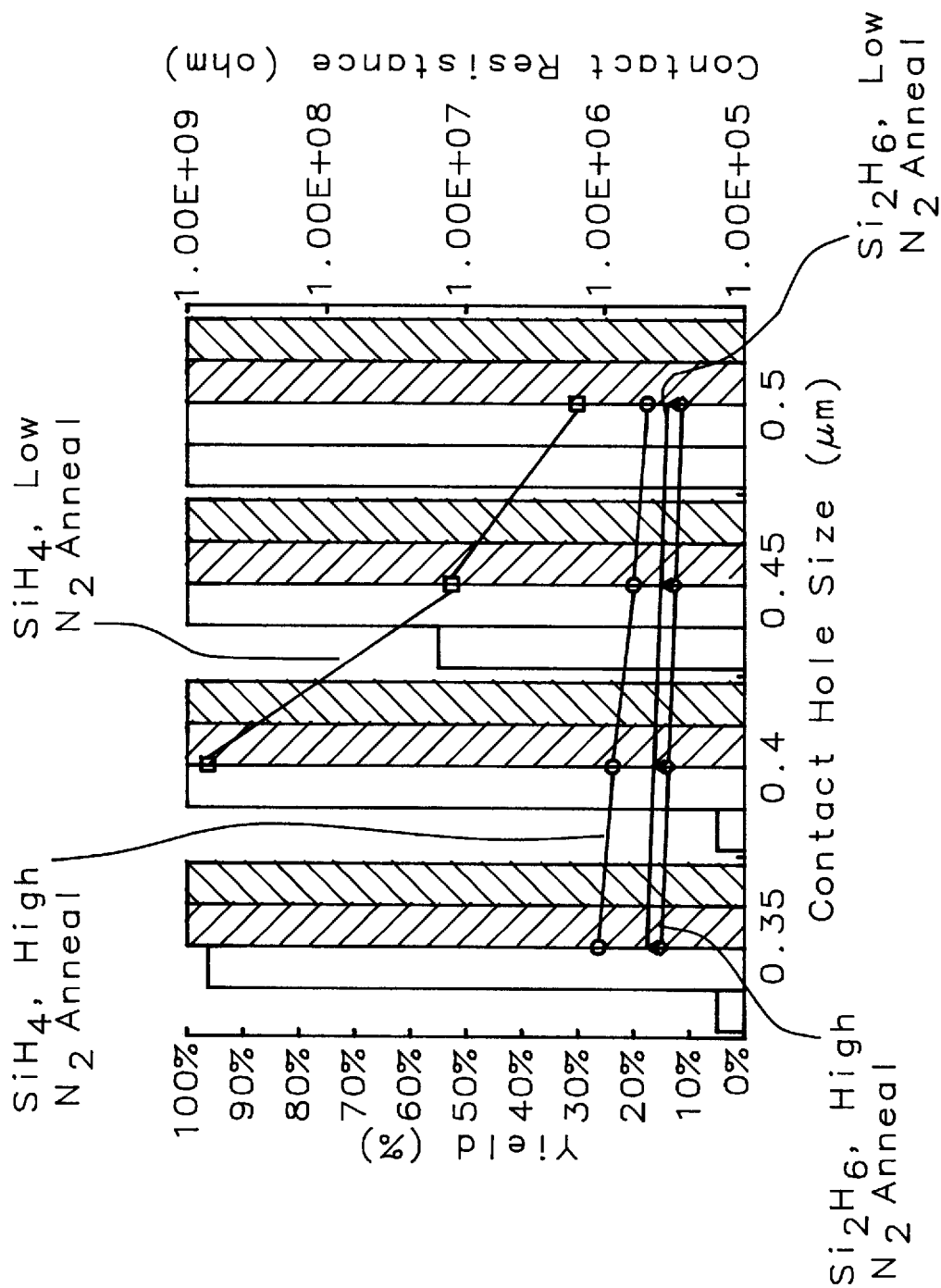
FIGS. 7–8, which in bar graph representation, illustrates the improvement in specific device paramaters obtained via the use of the optimized polycide contact process.
Figure 8:
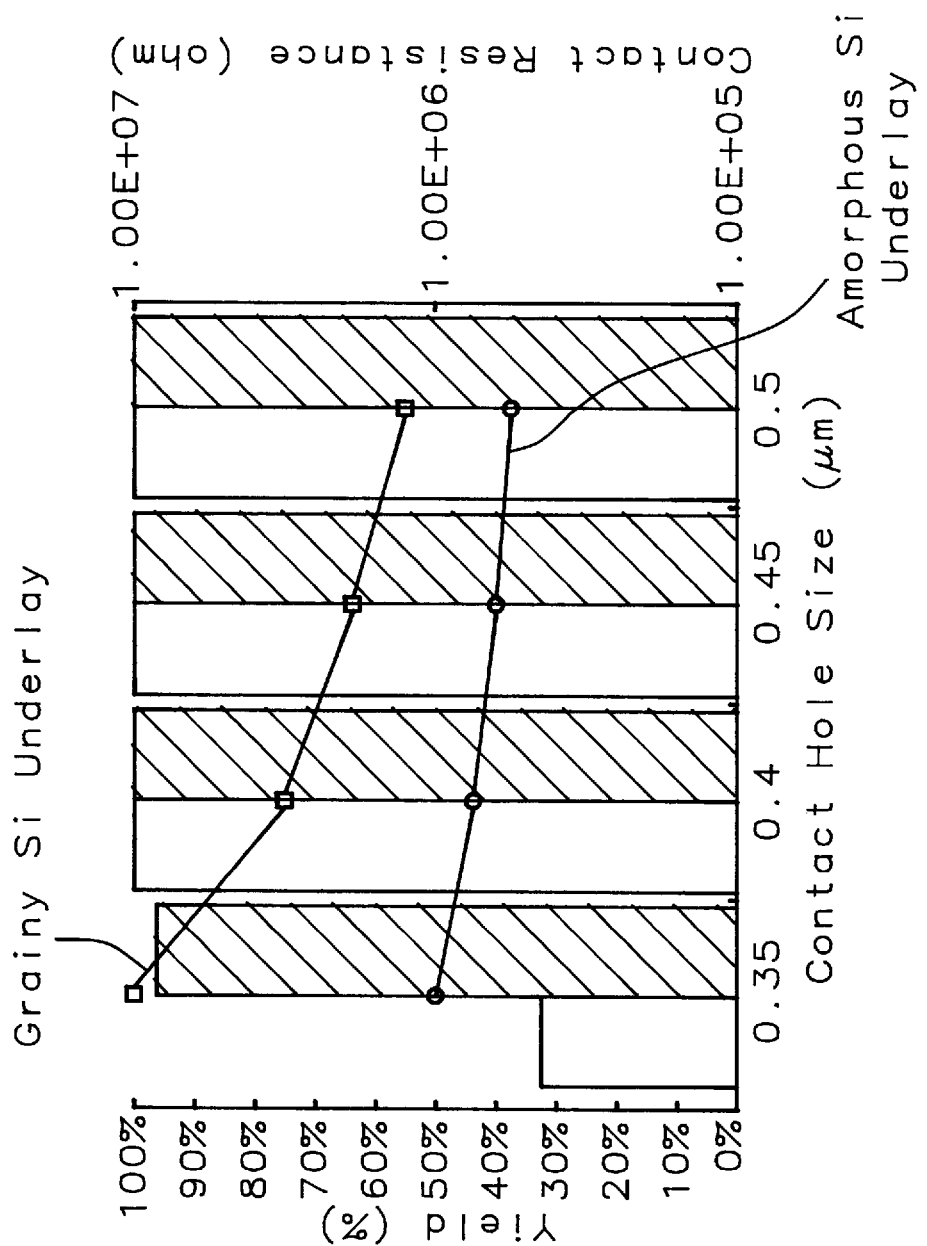

Finally FIGS. 7–8, indicate the benefits of this invention. It can be ssen in FIG. 7 that the tungsten silicide yield is dramatically improved, specifically for the smallest contact hole size, via the use of annealing in a high N2 flow. It can also be observed that the resistance in the contact is minimized as a result of an anneal using a high N2 flow. FIG. 8, shows the highest yield and lowest contact resistance resulting via the use of amorphous silicon underlays, as compared to counterparts fabricated using grainy silicon underlays.

This invention, an optimized, manufacturable tungsten polycide contact metallization, although shown as a part of an N type, (NFET), MOSFET device, can also be applied to P type, (PFET), MOSFET devices, and complimentary, (CMOS), and BiCMOS structures.

While this invention has been particularly shown and described with reference to, the preferred embodiments thereof, it will be understood by those skilled in the art that various changes in form and details may be made without departing from the spirit and scope of this invention.

What is claimed is:

1. A MOSFET device structure, on a semiconductor substrate, comprising:

field oxide regions in said semiconductor substrate;

a device region between said field oxide regions;

a gate insulator layer on said semiconductor substrate;

a polysilicon gate structure on said gate insulator layer, in center of said device region;

a source/drain region in said semiconductor substrate, between said polysilicon gate structure, and said field oxide region;

a first insulator layer, comprised of a first portion of said first insulator layer, located on said source/drain region, and a second portion of said first insulator layer, located on said polysilicon gate structure, and on said field oxide region, and with the top surface of said first portion of said first insulator layer, lower than the top surface of said second portion of said first insulator layer;

a straight walled contact hole in said first portion of said first insulator layer, exposing top surface of said source/drain region;

a layer of amorphous silicon, between about 300 to 700 Angstroms in thickness, contacting the top surface of one source/drain region, at the bottom of said straight walled contact hole, coating the sides of said straight walled contact hole, but not completely filling said straight walled contact hole, and extending from said straight walled contact hole, with a portion of said amorphous silicon layer overlying top surface of said first portion of said first insulator layer, and with a portion of said amorphous silicon layer overlying the top surface of said second portion of said first insulator layer;

a layer of tungsten silicide, between 1000 to 2000 Angstroms in thickness, on said amorphous silicon layer, in said straight walled contact hole, not completely filling said straight walled contact hole, and overlying the portion of said amorphous silicon layer, which overlays the top surface of said portion of said first insulator layer, and overlying the portion of said amorphous silicon layer which overlays said second portion of said first insulator layer;

a second insulator layer, with a first portion of said second insulator layer, completely filling said straight walled contact hole, and with a second portion of said second insulator layer, overlying the portion of said tungsten silicide, which in turn overlays said second portion of said first insulator layer, and with said second portion of said second insulator layer, overlaying said second portion of said first insulator layer;

a via hole in said second portion of said second insulator layer, exposing the top surface of said tungsten silicide layer, where said tungsten silicide layer lies on underlying amorphous silicon layer, in the region directly over the top surface of said second portion of said first insulator layer; and a metal structure, completely filling said via hole, and contacting said tungsten silicide layer, at the bottom of said via hole, in the region in which said tungsten silicide layer, lies directly over the top surface of said second portion of said first insulator layer.

2. The MOSFET device structure of claim 1, wherein said amorphous silicon layer, contains phosphorous, at a dose between about 1E15 to 5E15 atoms/cm$^2$, or with a phosphorous concentration of about 1E21 atoms/cm$^3$.

* * * * *